United States Patent [19]

Taeymans et al.

[11] Patent Number: 5,122,646
[45] Date of Patent: Jun. 16, 1992

[54] ELECTRONIC FRAUD DETECTOR

[75] Inventors: Jean. R. J. M. T. Taeymans, Wilrijk; Gustaaf W. T. Neutjens, Hoboken; Robertus J. E. Spoormans, Brecht, all of Belgium

[73] Assignee: Alcatel N.V., Amsterdam, Netherlands

[21] Appl. No.: 650,882

[22] Filed: Feb. 5, 1991

[30] Foreign Application Priority Data

Feb. 6, 1990 [EP] European Pat. Off. ........ 90200275.7

[51] Int. Cl.⁵ .................... G06K 19/06; G06K 5/00
[52] U.S. Cl. ................................. 235/492; 235/380
[58] Field of Search ............... 235/441, 439, 488, 492

[56] References Cited

U.S. PATENT DOCUMENTS

| 4,158,434 | 6/1979 | Peterson | 235/382 |
| 4,818,853 | 4/1989 | Ohta et al. | 235/380 |
| 4,888,474 | 12/1989 | Walton | 235/449 |
| 4,999,601 | 3/1991 | Gervais | 235/492 |

FOREIGN PATENT DOCUMENTS 0323347 7/1989 European Pat. Off. .
2554262 5/1985 France .

Primary Examiner—Stuart S. Levy
Assistant Examiner—Richard M. Weinberg
Attorney, Agent, or Firm—Christie, Parker & Hale

[57] ABSTRACT

A fraud detector for protecting an electronic device, e.g. a payphone, operating with electronic cards (FC) or chip cards which are inserted in a channel (CH) thereof and thereby connected to the payphone via electric contact elements (C) generally located at the end of the channel. The fraud consists in connecting an external chip card simulator (SIM) to the contact elements (C) by means of fraudulent electric wires (W) inserted in the channel (CH). The fraud detector is an electro-magnetic device which has a first coil (T1) for inducing an AC current in the wires (I) connecting the payphone to the contact elements (C), and a second coil (T2) surrounding the channel (CH) and for detecting this generated current when it flows through the fraudulent wires (W). The presence of the wires (W) is thus detected owing to the current flowing therethrough.

6 Claims, 1 Drawing Sheet

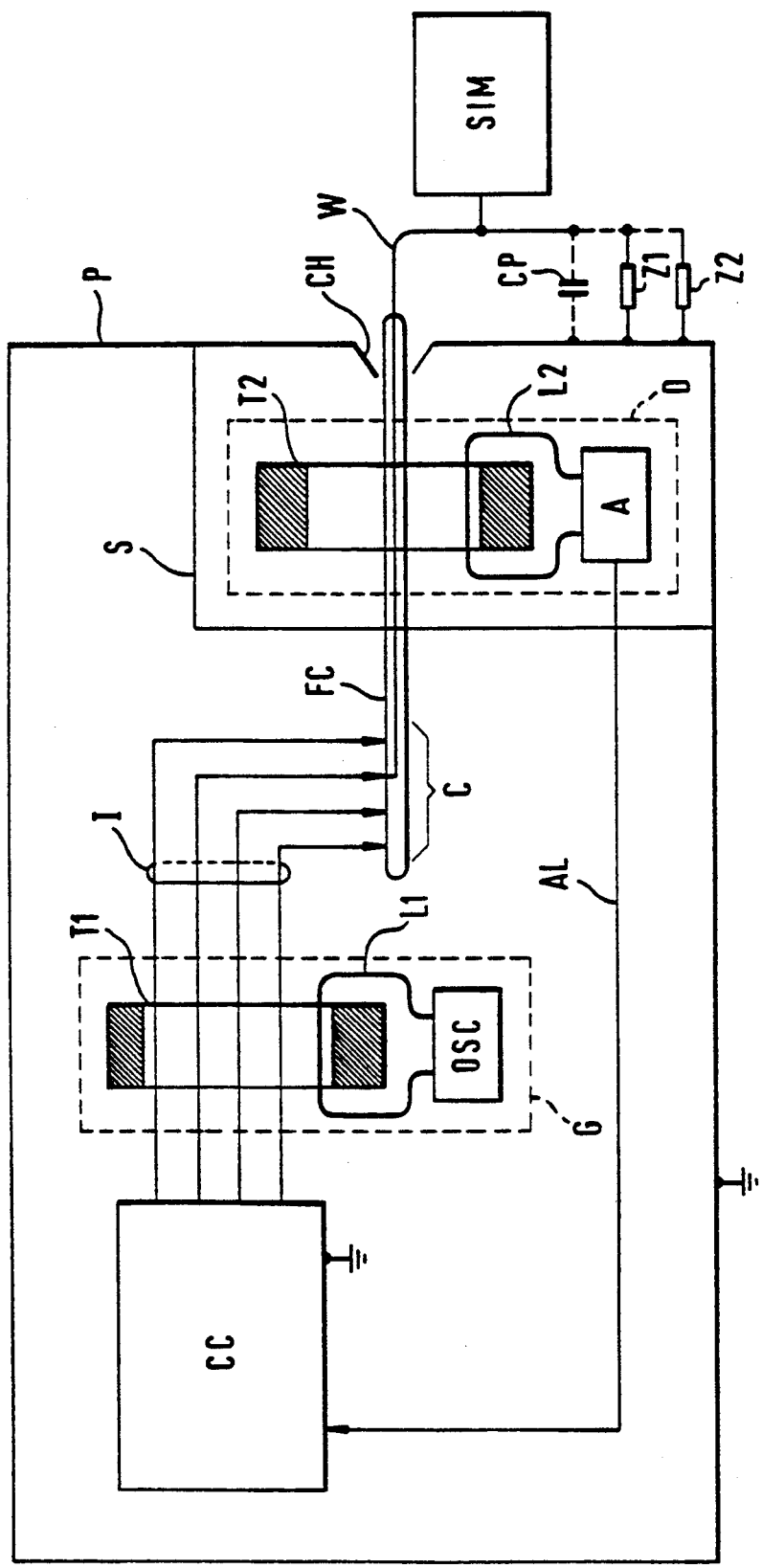

ELECTRONIC FRAUD DETECTOR

TECHNICAL FIELD

The present invention relates to an electronic fraud detector for a device able to read/write electronic cards provided with an electronic circuit and terminals, the device being provided with electrical contact elements and having a slot giving access to a channel wherein the card is inserted to bring the terminals thereof in electric contact with said contact elements.

BACKGROUND ART

A fraud detector including detection means for detecting the presence of an un-authorized electric wire inserted in the channel and which is in contact with said contact elements, is already known in the art, e.g. from the published French patent application 2.554.262. Therein the detection means include an electrically conductive plate mounted near to or in the channel so as to detect un-authorized or fraudulent electric wires inserted in this channel by means of the capacitive effect produced between the wire(s) and the plate.

A drawback of this known fraud detector is that the thickness and the dielectrical properties of the electric insulation as well as the diameter of the conductor forming the fraudulent wire may be such that the value of the capacitance created between this wire and the plate is close to that of a parasitic capacitance so that the detection means and thus also the fraud detector work improperly. Also the position of the wire in the channel may be such that it cannot be detected correctly by these detection means, e.g. when the wire is located too far from the plate.

DISCLOSURE OF INVENTION

An object of the present invention is to provide a fraud detector of the above known type but of which the ability of detecting fraudulent electric wires is improved.

This object is achieved due to the fact that said detection means are electro-magnetic means including an inductive coil able to detect a current flowing through said electric wire.

In this way, the detection of fraudulent wires of any type is facilitated.

Another characteristic feature of the present fraud detector is that it further includes an AC signal generator for generating said current to be detected.

The value (amplitude) and frequency of this current can thus be chosen to obtain optimized results from the fraud detector.

Yet another characteristic feature of the present invention is that said inductive coil surrounds said channel and is coupled to an amplifier for generating a signal indicative of the detection of said current and thus of the presence of said electric wire.

Because the coil surrounds the channel in which the wire is inserted, the position of the latter in this channel has no effect on the accuracy of the detection.

BRIEF DESCRIPTION OF DRAWINGS

The above mentioned and other objects and features of the invention will become more apparent and the invention itself will be best understood by referring to the following description of an embodiment taken in conjunction with the accompanying drawing which schematically represents a device, e.g. a payphone apparatus, able to read/write and to handle electronic cards and which is used in association with a fraud detector according to the invention.

BEST MODE FOR CARRYING OUT THE INVENTION

The device shown in the FIGURE, which is for instance a payphone apparatus, has an electrically grounded housing P and is provided with a slot constituting the end of a channel CH into which an electronic card or a chip card FC can be inserted. Such an electronic card generally carries a memory and a microprocessor unit which are integrated thereon. The card also has terminals which, when inserted in the channel CH of the apparatus, are brought into electrical contact with contact elements C, and so further to a handling device or control circuit CC via a plurality of interface lines I. The control circuit CC of the payphone apparatus can perform different functions amongst which is the reading and writing of the memory built on the electronic card.

It is known that a person who wants to commit a fraud on the payphone apparatus replaces the normal electronic card by a dummy or fraudulent one which is only provided with the above terminals and a plurality of electrical wires W which connect these terminals to an external card simulator SIM. The latter SIM is then able to collect and/or generate signals which are transmitted between the simulator SIM and the control circuit CC via the fraudulent electric wires W, the terminals, the contact elements C and the interface lines I. In this way, the operation of a normal electronic card FC can be simulated.

To prevent this fraudulent use of the payphone apparatus, the latter contains a fraud detector able to detect the fraudulent electric wires W inserted in the channel CH. To this end the fraud detector is constituted by both a generator G which induces a current in the interface lines I, and a detector D which detects this current when it flows through the fraudulent electric wires W.

In more detail, the generator G is constituted by an oscillator OSC which produces an AC signal having a frequency of about 30 MHz and which is coupled to a winding L1 of an inductive coil T1 surrounding the interface lines I. The inductive coil T1 has the shape of a ring around the interface lines I and is shown in cross sectional view in the FIGURE. The high frequency signal generated in the winding L1 produces a high frequency magnetic field in the inductive coil T1 which in turn induces a high frequency signal on the interface lines I. The latter signal or current is superposed to the normal currents on the interface lines I and is such that it does not disturb the normal operation of the payphone apparatus and more particularly of the control circuit CC thereof when a normal electronic card FC is inserted in the channel CH.

The detector D is constituted by a second inductive coil T2 which surrounds the channel CH and is also shown in a cross sectional view in the FIGURE. This second inductive coil T2 is located over the channel CH between the slot and the contact elements C and has a winding L2 connected to an amplifier A. The output of this amplifier A is connected to the control circuit CC via an alarm wire AL carrying a like-named signal.

It is to be noted that the detector D is protected against external, e.g. parasitic, magnetic fields, especially those which can be produced by the inductive coil T1, by an electromagnetic shield S connected to the ground and into which the detector D is enclosed.

When a normal electronic card FC is inserted in the channel CH the above high frequency current induced in the interface lines I by the inductive coil T1 has no influence on the inductive coil T2. This is due to the fact that there are no electric wires such as W for bringing this current in the channel CH and more particularly in the inductive coil T2 thereof. As a result there is no current flowing in the winding L2 and the amplifier A does not produce any detection signal or alarm signal AL at its output connected to the like-named alarm wire.

However, when a fraudulent electronic card with the electric wires W is inserted in the channel CH, the above AC current induced in the interface lines I by the inductive coil T1 flows also through these wires W. This current flow is possible because of a parasitic coupling between the part of the wires W external to the payphone apparatus and the grounded housing P of the latter. The parasitic coupling is for instance constituted by a parasitic capacitance CP in parallel with a radiation impedance Z1 and with a possible galvanic impedance Z2.

The AC current flowing through the electric wires W induces a magnetic field in the coil T2 which in turn give rise to a current in the winding L2 thereof. This current is then applied to the amplifier A. If the current in the winding L2 exceeds a predetermined threshold value, the amplifier A produces an alarm signal on the alarm wire AL connected to the control circuit CC. The control circuit CC may then for instance inhibit the normal operation of the payphone.

While the principles of the invention have been described above in connection with specific apparatus, it is to be clearly understood that this description is made only by way of example and not as a limitation on the scope of the invention.

We claim:

1. Fraud detecting device for reading and writing electronic cards, said device being provided with an electronic circuit and terminals, said device comprising a plurality of electrical contact elements,
   a slot giving access to a channel wherein said card is inserted to bring the terminals thereof in electric contact with said contact elements,
   a control circuit for reading/writing said inserted electronic card,
   interface conductors coupling said control circuit to said electrical contact elements, and
   electromagnetic detection means for detecting the presence of a fraudulent electric wire in contact with said contact elements and extending along said channel to said slot, wherein said detection means further comprises
   an AC signal generator for generating a detection current,
   a first inductive coil responsive to the AC signal generator and surrounding said interface conductors for inducing a corresponding current in said interface conductors and thereby in said fraudulent electric wire when it is in inserted in said channel in electrical contact with at least one of said contact elements, and
   a second inductive coil located in said channel between said contact elements and said slot for detecting the corresponding current induced in said fraudulent electric wire extending from said contact elements to said slot.

2. Fraud detecting device according to claim 1, wherein said second inductive coil surrounds said channel at a position between said contact elements and said slot and is coupled to an amplifier for generating a signal indicative of the detection of said current and thus of the presence of said fraudulent electric wire.

3. Fraud detecting device according to claim 1, wherein said current generated by said AC signal generator has a frequency of about 30 Megahertz.

4. Fraud detecting device according to claim 1, wherein said first inductive coil is magnetically insulated from said second inductive coil.

5. Fraud detecting device according to claim 4, wherein said detection means is enclosed in an electromagnetic shield.

6. Fraud detecting device according to claim 1, wherein said electronic circuit is integrated on said electronic card.

* * * * *